United States Patent [19]

Mathur

[11] Patent Number: 4,717,791
[45] Date of Patent: Jan. 5, 1988

[54] SHIELD STRUCTURE FOR LIMITING TRANSMISSION OF ELECTROMAGNETIC RADIATION

[75] Inventor: Hemendra K. Mathur, Beaverton, Oreg.

[73] Assignee: Tektronix, Inc., Beaverton, Oreg.

[21] Appl. No.: 883,887

[22] Filed: Jul. 9, 1986

[51] Int. Cl.⁴ ............................................. H05K 9/00
[52] U.S. Cl. .................................. 174/35 R; 361/424
[58] Field of Search .......... 174/35 R, 35 MS, 35 GC; 361/424; 219/10.55 D

[56] References Cited

U.S. PATENT DOCUMENTS

| | | | |
|---|---|---|---|
| 2,133,789 | 10/1938 | Pool | 174/35 GC |
| 2,317,813 | 4/1943 | Schoenborn | 174/35 GC |
| 4,384,165 | 5/1983 | Loving, Jr. et al. | 174/35 GC |
| 4,567,318 | 1/1986 | Shu | 174/35 GC |

Primary Examiner—A. T. Grimley
Assistant Examiner—David A. Tone
Attorney, Agent, or Firm—John Smith-Hill; George T. Noe

[57] ABSTRACT

A shield structure for limiting transmission of electromagnetic radiation between two locations, one of which is inside the shield structure and the other of which is outside the shield structure, comprises first and second shell portions of electrically-conductive material. The first shell portion has a rim that defines an opening. A major part of the second shell portion corresponds substantially in shape to the shape of the opening, and its size is slightly smaller than that of the opening. One of the shell portions has tabs that are distributed about the opening and project towards the other shell portion. The tabs are electrically conductive, and provide electrically-conductive contact between the first and second shell portions.

3 Claims, 5 Drawing Figures

SHIELD STRUCTURE FOR LIMITING TRANSMISSION OF ELECTROMAGNETIC RADIATION

This invention relates to a shield structure for limiting transmission of electromagnetic radiation.

BACKGROUND OF THE INVENTION

Many electrical circuits emit electromagnetic radiation when in operation. Electromagnetic interference (EMI) codes established by various regulatory bodies impose limitations upon acceptable levels of electromagnetic radiation that may be emitted by electrical apparatus, such as a test and measurement instrument, in order to prevent interference with other equipment. Frequently, it is not practicable to design the circuits of a test and measurement instrument so that the level of electromagnetic radiation emitted by the circuits is below the levels of the EMI codes, and therefore it is necessary to mount the circuits in an enclosure that contains the radiation emitted by the circuits and shields other equipment from electromagnetic radiation emitted by the instrument circuits. It is also desirable that ambient radiation be prevented from entering the test and measurement instrument and affecting the operation of its circuits.

A detail of the enclosure of a conventional test and measurement instrument, specifically an oscilloscope, is shown in FIG. 1 of the accompanying drawings. The instrument enclosure comprises a main chassis 2 from which the functional elements of the instrument, e.g., circuit boards and a CRT, are supported. The main chassis is made of metal, and includes a front plate 4, a back plate 24, and side rails 12 that join the front and back plates. Flanges 14 extend somewhat towards the back of the instrument from the front plate 4. The main chassis is made by stamping openings in a rectangular sheet of metal and then bending parts of the sheet to form the distinct front and back plates, the side rails and various flanges, including the flanges 14. Overlying the front plate 4 of the chassis is an instrument front panel 6. The panel 6 is made of synthetic plastic material and bears indicia relating to the functions and operation of the instrument. The front panel is secured to the chassis by means of a frame 10 which also is made of synthetic plastic material. The main chassis, with the front panel 6 and the frame 10 attached thereto, is slid into a cabinet 20, and the main chassis is secured to the cabinet using screws (not shown) that extend through the back wall 22 of the cabinet and engage the back plate 24 of the chassis. The cabinet 20 has a rim 26 that is received in the space 18 between the flanges 14 and the frame 10.

In order to meet current EMI codes, and also to provide a convenient path for ground current, it is necessary that the cabinet 20 and the chassis 2 together provide a substantially closed electrically conductive surface enclosing the electrical components of the instrument, and that the maximum linear dimension of any discontinuity in the electrically conductive surface be less than about 4 cm in length. It is therefore important that the length of any electrical discontinuity between the cabinet and the chassis in the region of the rim 26 be less than about 4 cm in length. Of course, the maximum permissible length of a discontinuity depends on the frequency of the radiation that is to be contained, and therefore it may, in some cases, be greater than 4 cm and in others it may be less than 4 cm.

In order to minimize discontinuities between the cabinet 20 and the chassis 2 in the region of the rim 26 of the cabinet, a flexible, electrically conductive gasket is placed in the space 18 between the flange 14 and the frame 10, ahead of the rim 26 of the cabinet. The gasket comprises a core 30 of flexible synthetic plastic material and a sleeve 32 of conductive mesh through which the core 30 extends. When the rim of the cabinet is pushed into the space 18, the gasket is compressed between the rim 26 of the cabinet and the frame 10 and is distorted in shape so that it makes contact with the front plate 4 or the flange 14.

The forces exerted on the gasket are such as to ensure a firm pressure contact between the gasket and both the rim 26 and the front portion of the frame 10, but since the frame 10 is made of dielectric material this has substantially no shielding effect with respect to electromagnetic radiation emitted by the electrical components of the oscilloscope. The nature of the gasket is not such as to ensure that an electrically-conductive pressure contact between the gasket and the chassis will be reliably achieved with discontinuities less than 4 cm in length.

SUMMARY OF THE INVENTION

A preferred embodiment of the invention is a shield structure for limiting transmission of electromagnetic radiation between two locations, one of which is inside the shield structure and the other of which is outside the shield structure. The shield structure comprises first and second shell portions made of electrically-conductive material. The first shell portion has a rim that defines an opening. A major part of the second shell portion corresponds substantially in shape to the shape of the opening, and its size is slightly smaller than that of the opening. One of the shell portions has tabs that are distributed about the opening and project towards the other shell portion. The tabs are electrically conductive, and provide electrically-conductive contact between the first and second shell portions.

BRIEF DESCRIPTION OF THE DRAWINGS

For a better understanding of the invention, and to show how the same may be carried into effect, reference will now be made, by way of example, to the accompanying drawings in which.

In the different figures, like reference numerals denote corresponding elements.

DETAILED DESCRIPTION

Figure 1:
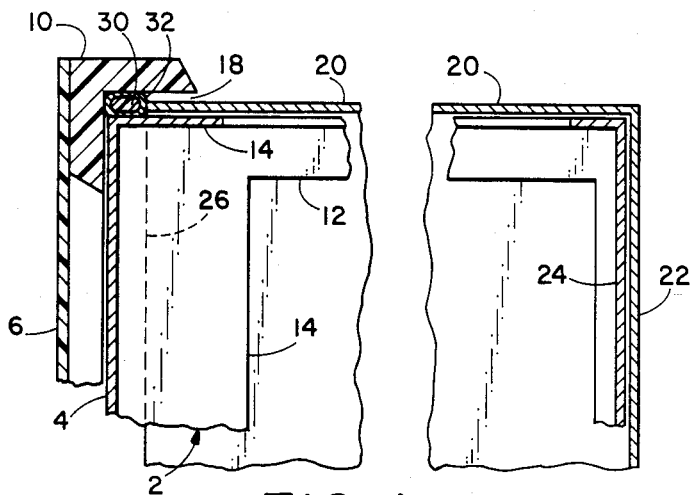
FIG. 1 is a simplified sectional partial view of a conventional shield structure.
Figure 2:
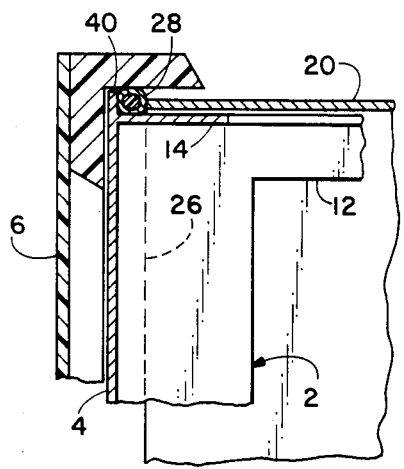
FIG. 2 is a view similar to FIG. 1 illustrating a first shield structure embodying the present invention.

The shield structure shown in FIG. 2 is similar to that shown in FIG. 1 except that the front plate 4 is provided with tabs 40 that project outwardly beyond the flange 14. When a conductive gasket 28, e.g., of the kind comprising a core of synthetic plastic material and a conductive sleeve, is inserted in the space 18 between the flange 14 and the frame 10, and the rim 26 of the cabinet 20 is inserted into the space, the gasket 28 is trapped between the tabs 40 and the rim 26, and electrically conductive contact is reliably established between the gasket and the tabs 40. Thus, there is no discontinuity in the electrical shielding that is greater in length than the distance between adjacent tabs.

The tabs 40 are formed by stamping C-shaped openings in the plate used to form the chassis prior to bending the flanges 14 out of the plane of the front plate 4. Accordingly, the cost of providing the tabs is very small.

Figure 5:
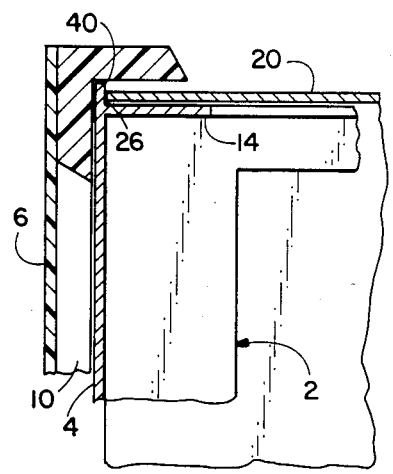
FIG. 5 is a view similar to FIG. 1 of a second shield structure embodying the invention.
Figure 3:
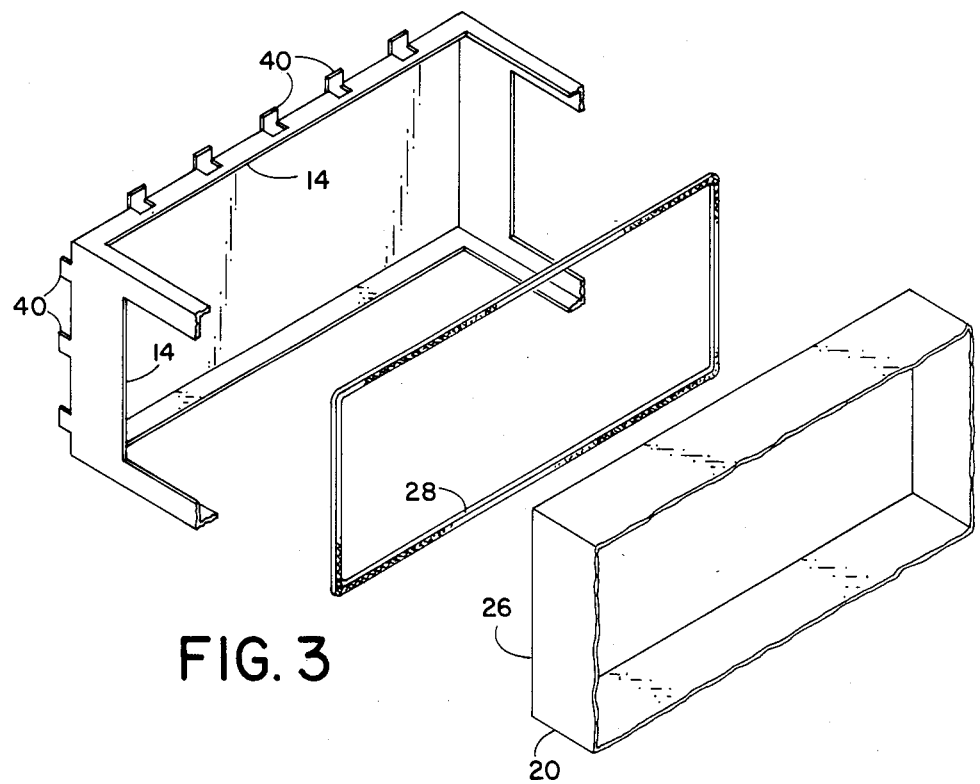
FIG. 3 is a perspective exploded partial view of the FIG. 2 shield structure.
Figure 4:
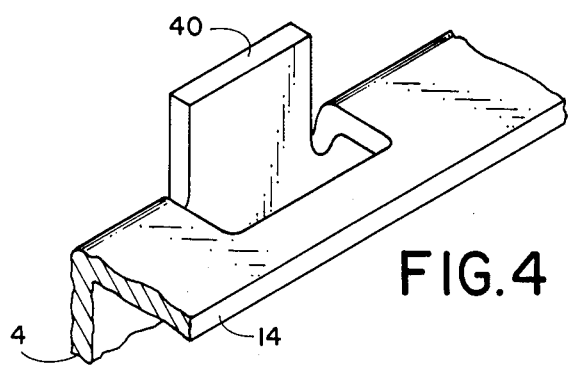
FIG. 4 shows a detail of FIG. 3.

In the case of FIGS. 2, 3 and 4, the resilient nature of the gasket takes up variations in the distance between the rim 26 and the tabs 40. This is necessary because the tabs 40 are stiff. In the case of FIG. 5, the chassis is made of lighter gauge material and accordingly the tabs 40 are thinner and are somewhat springy. In this case, no gasket is necessary because the resiliance of the tabs themselves enables difference in clearance between the tabs and the rim of the cabinet to be eliminated.

An alternative method of providing flexible tabs would be to attach them to the main chassis 2, but clearly this would add to the cost of manufacturing the instrument.

It will be appreciated that the present invention is not restricted to the particular embodiments that have been described and illustrated, and that variations may be made therein without departing from the scope of the invention as defined in the appended claims and equivalents thereof. In particular, it is not necessary that the gasket of the FIG. 2 shield structure comprise a core of synthetic plastic material and a conductive sleeve, since a gasket of conductive plastic material may be used instead.

I claim:

1. A shield structure for limiting transmission of electromagnetic radiation between first and second locations, comprising:

a first shell portion of electrically-conductive material and having a rim that defines an opening;

a second shell portion of electrically-conductive material and having a plate the shape of which corresponds substantially to the shape of the opening and which is slightly smaller in size than the opening, said plate being substantially planar and having coplanar tabs formed integrally therewith, said tabs projecting beyond the periphery of said plate and entering into electrically conductive contact with the rim of said first shell portion; and a resiliently-compressible and electrically-conductive gasket member interposed between the rim of said first shell portion and said tabs.

2. A shield structure according to claim 1, wherein the tabs are resiliently deformable with respect to the plane of the plate.

3. A shield structure according to claim 1, wherein said first shell portion defines a cabinet having an interior space and the second shell portion includes parts that project from the plate into the interior space of the cabinet.

* * * * *